US012765208B2

(12) United States Patent
Lou et al.

(10) Patent No.: US 12,765,208 B2
(45) Date of Patent: Oct. 13, 2026

(54) DISPLAY PANEL AND DISPLAY APPARATUS

(71) Applicant: Hefei Visionox Technology Co., Ltd., Hefei (CN)

(72) Inventors: Junhui Lou, Hefei (CN); Yanqin Song, Hefei (CN); Lu Zhang, Hefei (CN); Chuanzhi Xu, Hefei (CN)

(73) Assignee: Hefei Visionox Technology Co., Ltd., Hefei (CN)

( * ) Notice: Subject to any disclaimer, the term of this patent is extended or adjusted under 35 U.S.C. 154(b) by 580 days.

(21) Appl. No.: 18/336,284

(22) Filed: Jun. 16, 2023

(65) Prior Publication Data

US 2023/0329062 A1 Oct. 12, 2023

Related U.S. Application Data

(63) Continuation of application No. PCT/CN2021/135942, filed on Dec. 7, 2021.

(30) Foreign Application Priority Data

May 8, 2021 (CN) ........................ 202110500536.X

(51) Int. Cl.
*H10K 59/35* (2023.01)
*H10K 59/121* (2023.01)
*H10K 59/131* (2023.01)

(52) U.S. Cl.
CPC ......... *H10K 59/353* (2023.02); *H10K 59/121* (2023.02); *H10K 59/131* (2023.02)

(58) Field of Classification Search
CPC .. H10K 59/353; H10K 59/121; H10K 59/131; H10K 59/1213; H10K 59/35;
(Continued)

(56) References Cited

U.S. PATENT DOCUMENTS

2022/0069047 A1* 3/2022 Yang .................. H10K 59/1213
2022/0293715 A1* 9/2022 Du ....................... H10K 59/131
2024/0179944 A1* 5/2024 Wang .................. H10D 86/441

FOREIGN PATENT DOCUMENTS

CN 110070801 A 7/2019
CN 110189627 A 8/2019
(Continued)

OTHER PUBLICATIONS

International Search Report issued on Feb. 23, 2022, in corresponding in International Application No. PCT/CN2021/135942, 6 pages.
(Continued)

*Primary Examiner* — Steven B Gauthier
*Assistant Examiner* — Alvin L Lee
(74) *Attorney, Agent, or Firm* — Maier & Maier, PLLC

(57) ABSTRACT

A display panel and a display apparatus. The display panel includes: first pixel units located in the first display area and each including a first sub-pixel, a second sub-pixel; and first pixel circuits located in the transition display area and each including a first circuit for driving the first sub-pixel, a second circuit for driving the second sub-pixel and a third circuit for driving the third sub-pixel, in which the first pixel circuits for driving the first pixel units in a same column are located in at least two adjacent columns, and an arrangement pattern of the first circuits and the second circuits is the same as an arrangement pattern of the first sub-pixels and the second sub-pixels respectively driven by the first circuits and the second circuits.

18 Claims, 9 Drawing Sheets

(58) Field of Classification Search
CPC .. H10K 59/352; G09G 3/2074; G09G 3/3233; G09G 2300/0426; G09G 2300/0465
See application file for complete search history.

(56) References Cited

FOREIGN PATENT DOCUMENTS

| | | | |
|---|---|---|---|
| CN | 110751926 | A | 2/2020 |
| CN | 110767720 | A | 2/2020 |
| CN | 110783384 | A | 2/2020 |
| CN | 111048005 | A | 4/2020 |
| CN | 111129100 | A | 5/2020 |
| CN | 111402743 | A | 7/2020 |
| CN | 112038373 | A | 12/2020 |
| CN | 112562518 | A | 3/2021 |
| CN | 113241031 | A | 8/2021 |
| EP | 3624102 | A1 | 3/2020 |
| KR | 1020170133717 | A | 12/2017 |
| KR | 1020180033361 | A | 4/2018 |
| WO | 2020192083 | A1 | 10/2020 |
| WO | 2021027111 | A1 | 2/2021 |

OTHER PUBLICATIONS

Office Action issued on Feb. 7, 2022, in corresponding Chinese Application No. 202110500536.X, 8 pages.
Notice of Granting issue May 23, 2022, in Chinese Application No., 202110500536.X, 8 pages.
Office Action issued on Apr. 30, 2024, in corresponding Korean Application No. 10-2023-7020663, 14 pages.

* cited by examiner

DISPLAY PANEL AND DISPLAY APPARATUS

CROSS REFERENCE TO RELATED APPLICATION

The present application is a continuation of International Application No. PCT/CN2021/135942 filed on Dec. 7, 2021, which claims the priority to Chinese Patent Application No. 202110500536.X filed on May 8, 2021, both of which are incorporated herein by reference in their entireties.

TECHNICAL FIELD

The present application relates to the field of display technology, and particularly, to a display panel and a display apparatus.

BACKGROUND

With the rapid development of electronic devices, demands of users for the screen-to-body ratio are higher and higher, resulting in that the full-screen display of electronic devices attracts more and more attention in the industry.

Traditional electronic devices such as a cell phone and a tablet computer need to integrate a front camera, a telephone receiver, an infrared sensing component and the like. In the prior art, a notch or a hole may be formed in the display screen so that external light can enter the photosensitive component under the screen through the notch or the hole. Nonetheless, these electronic devices do not achieve a real full-screen display, and cannot display an image in all areas of the entire screen. For example, the area corresponding to the front camera cannot display the image.

SUMMARY

Embodiments of the present application provide a display panel and a display apparatus, at least part of the display panel can be light-transmitting and can be used to display, facilitating the integration of the photosensitive component under the screen.

Embodiments of a first aspect of the present application provide a display panel including a first display area, a second display area, and a transition display area located between the first display area and the second display area, a light transmittance of the first display area being greater than a light transmittance of the transition display area, the display panel including: first pixel units located in the first display area and each including a first sub-pixel, a second sub-pixel, and a third sub-pixel, the first sub-pixels, the second sub-pixels and the third sub-pixels being arranged in an array; and first pixel circuits located in the transition display area and each including a first circuit for driving the first sub-pixel, a second circuit for driving the second sub-pixel and a third circuit for driving the third sub-pixel, the first circuits, the second circuits and the third circuits being arranged in an array in the transition display area, wherein the first pixel circuits for driving the first pixel units in a same column are located in at least two adjacent columns, and an arrangement pattern of the first circuits and the second circuits is the same as an arrangement pattern of the first sub-pixels and the second sub-pixels respectively driven by the first circuits and the second circuits.

According to an implementation of the first aspect of the present application, the first sub-pixels and the second sub-pixels are alternately arranged along a second direction to form first pixel columns, two first pixel columns adjacent in a first direction are staggered along the second direction, so that the first sub-pixels and the second sub-pixels are alternately arranged along the first direction; and the first circuits and the second circuits are arranged along the second direction to form first circuit columns, the first circuits and the second circuits for driving at least one first pixel column are located in at least two first circuit columns adjacent along the first direction.

According to any of the above implementations of the first aspect of the present application, the third sub-pixels are arranged in sequence along a second direction to form a second pixel column, a plurality of the third circuits are arranged along the second direction to form a second circuit column, and an arrangement pattern of the third circuits is the same as an arrangement pattern of the third sub-pixels.

According to any of the above implementations of the first aspect of the present application, the first circuit and the first sub-pixel driven by the first circuit are arranged in a same row, the second circuit and the second sub-pixel driven by the second circuit are arranged in a same row, and the third circuit and the third sub-pixel driven by the third circuit are arranged in a same row.

According to any of the above implementations of the first aspect of the present application, the display panel further includes: signal lines including first signal lines located in the transition display area, the first signal line being connected to a plurality of first pixel circuits for driving the first pixel units in a same column; and the first signal line including a first segment and a second segment connected successively, the first segment being configured to connect the first pixel circuits located in different rows and the second segment being configured to connect the first pixel circuits located in different columns, a material of the second segment including a transparent material.

According to any of the above implementations of the first aspect of the present application, the display panel further includes a connecting wire, the first pixel circuit and the first pixel unit connected to the first pixel circuit are arranged in a same row, the connecting wire extends in a first direction and is configured to connect the first pixel unit and the first pixel circuit, and a material of the connecting wire includes a transparent material.

According to any of the above implementations of the first aspect of the present application, the connecting wire and the second segment are arranged in a same layer and with a same material.

According to any of the above implementations of the first aspect of the present application, the display panel further includes: transition pixel units located in the transition display area; transition pixel circuits located in the transition display area and configured to drive the transition pixel units; and the signal lines further including transition signal lines located in the transition display area, the transition signal line being connected to a plurality of transition pixel circuits for driving the transition pixel units in a same column, and the first signal line and the transition signal line corresponding to the first pixel unit and the transition pixel unit located in a same column being connected to each other.

According to any of the above implementations of the first aspect of the present application, for the first signal line and the transition signal line corresponding to the first pixel unit and the transition pixel unit located in a same column, the transition signal line is located on at least one side of the first pixel unit in the column in a second direction.

According to any of the above implementations of the first aspect of the present application, a size of the first pixel unit is less than a size of the transition pixel unit with a same color.

According to any of the above implementations of the first aspect of the present application, the display panel further includes: second pixel units located in the second display area; second pixel circuits for driving the second pixel units and located in the second display area; the signal lines further including second signal lines located in the second display area, the second signal line being connected to a plurality of second pixel circuits for driving the second pixel units in a same column, in which a ratio between a column number of the second pixel units and a number of the second signal lines is a first ratio, and a ratio between a column number of the transition pixel units and a sum of numbers of the first signal lines and the transition signal lines is a second ratio equal to the first ratio.

According to any of the above implementations of the first aspect of the present application, a size of the first pixel unit is less than a size of the second pixel unit with a same color.

According to any of the above implementations of the first aspect of the present application, a size of the transition pixel unit is less than a size of the second pixel unit with a same color.

According to any of the above implementations of the first aspect of the present application, the first signal line is connected to one end of the transition signal line; or the first signal line is connected between two ends of the transition signal line, at least one of the transition signal lines includes a third segment and a fourth segment, the third segment and at least part of the first signal line are overlapped along a first direction, the fourth segment and the first signal line are staggered along the first direction, and a material of the third segment includes a transparent material.

According to any of the above implementations of the first aspect of the present application, the third segment and the second segment are arranged in a same layer and with a same material.

According to any of the above implementations of the first aspect of the present application, the fourth segment and the first segment are arranged in a same layer and with a same material.

According to any of the above implementations of the first aspect of the present application, the transition display area includes a plurality of annular areas surrounding a circumference of the first display area and being distributed concentrically with the first display area, and the first pixel circuits for driving the first pixel units in a same column are distributed in sequence within a same annular area; the first display area is arranged symmetrically about a second axis of symmetry, the second axis of symmetry extends along a second direction and passes through a center of the first display area, the first pixel circuits corresponding to two columns of first pixel units distributed symmetrically about the second axis of symmetry are located in a same annular area, and the first pixel circuit is located at a side of the first pixel unit connected to the first pixel circuit away from the second axis of symmetry; and two transition signal lines for connecting the first pixel circuits in a same annular area are arranged symmetrically about the second axis of symmetry.

According to any of the above implementations of the first aspect of the present application, a plurality of the first pixel circuits are arranged symmetrically about the second axis of symmetry, and a plurality of the transition signal lines are arranged symmetrically about the second axis of symmetry.

According to any of the above implementations of the first aspect of the present application, a plurality of the first pixel circuits are arranged symmetrically about a first axis of symmetry extending along a first direction and passing through the center of the first display area, and the transition signal lines are arranged symmetrically about the first axis of symmetry.

According to any of the above implementations of the first aspect of the present application, the first display area is round, oval, or regular polygonal in shape.

Embodiments of a second aspect of the present application provide a display apparatus including the display panel of any of the above embodiments of the first aspect.

According to the display panel of the embodiments of the first aspect of the present application, the light transmittance of the first display area is greater than the light transmittance of the transition display area, so that the photosensitive component may be integrated on the rear of the first display area of the display panel. An under-screen integration is achieved for the photosensitive component such as a camera, and moreover, the first display area can display the image, the display area of the display panel is increased and a full-screen design is achieved for the display apparatus.

According to the display panel of the embodiments of the first aspect of the present application, the first pixel circuits for driving the first pixel units are located in the transition display area, wiring in the first display area can be reduced to increase the light transmittance of the first display area. The first pixel unit includes the first sub-pixel, the second sub-pixel and the third sub-pixel, through which the display panel displays a color image. The first pixel circuit includes the first circuit for driving the first sub-pixel, the second circuit for driving the second sub-pixel, and the third circuit for driving the third sub-pixel, through which the first sub-pixel, the second sub-pixel, and the third sub-pixel are driven to display. In addition, the first pixel circuits for driving the first pixel units in a same column are located in at least two adjacent columns, so that a plurality of the first pixel circuits can be arranged surrounding the first display area, the space between the first pixel circuit and the first pixel unit driven by the first pixel circuit is reduced. The arrangement pattern of the first circuits and the second circuits is the same as the arrangement pattern of the first sub-pixels and the second sub-pixels respectively driven by the first circuits and the second circuits, wiring of the display panel can be simplified, a disordered image display due to the non-correspondence between the first pixel unit and the first pixel circuit is avoided, and the control accuracy and the display effect of the display panel are improved.

BRIEF DESCRIPTION OF THE DRAWINGS

Other features, objects and advantages of the present application will become more apparent from reading the following detailed description of the non-limiting embodiments with reference to the accompanying drawings, in which the same or similar reference numerals represent the same or similar features, and the accompanying drawings are not drawn to actual scale.

DETAILED DESCRIPTION

Features and exemplary embodiments of various aspects of the present application will be described in detail below, and in order to make the purpose, technical solutions and advantages of the present application clearer, the present application is described in further detail below in combination with the accompanying drawings and specific embodiments. It should be understood that the specific embodiments described herein are used to explain the present application only, but not to limit the present application. For those skilled in the art, the present application can be implemented without some of these specific details. The following description of the embodiments is only to provide a better understanding of the present application by illustrating examples of the present application.

In an electronic device such as a cell phone and a tablet computer, photosensitive components such as a front camera, an infrared light sensor, a proximity light sensor and the like need to be integrated at a side of the display panel 10. In some embodiments, a light-transmitting display area may be arranged on the electronic device, and the photosensitive components may be arranged on the back of the light-transmitting display area to achieve a full-screen display for the electronic device while ensuring the normal operation of the photosensitive components.

In order to increase the light transmittance of the light-transmitting display area, the driving circuit for the light-transmitting area is generally arranged in a non-light-transmitting area, which results in that the driving circuits for the pixel units in a same column of the display panel may be located in different columns, making it difficult to drive the pixel units of the display panel row by row and column by column.

To solve the above problems, the embodiments of the present application provide a display panel and a display apparatus, which will be described below with reference to the drawings.

The embodiments of the present application provide a display panel, which may be an organic light emitting diode (Organic Light Emitting Diode, OLED) display panel.

Figure 1:
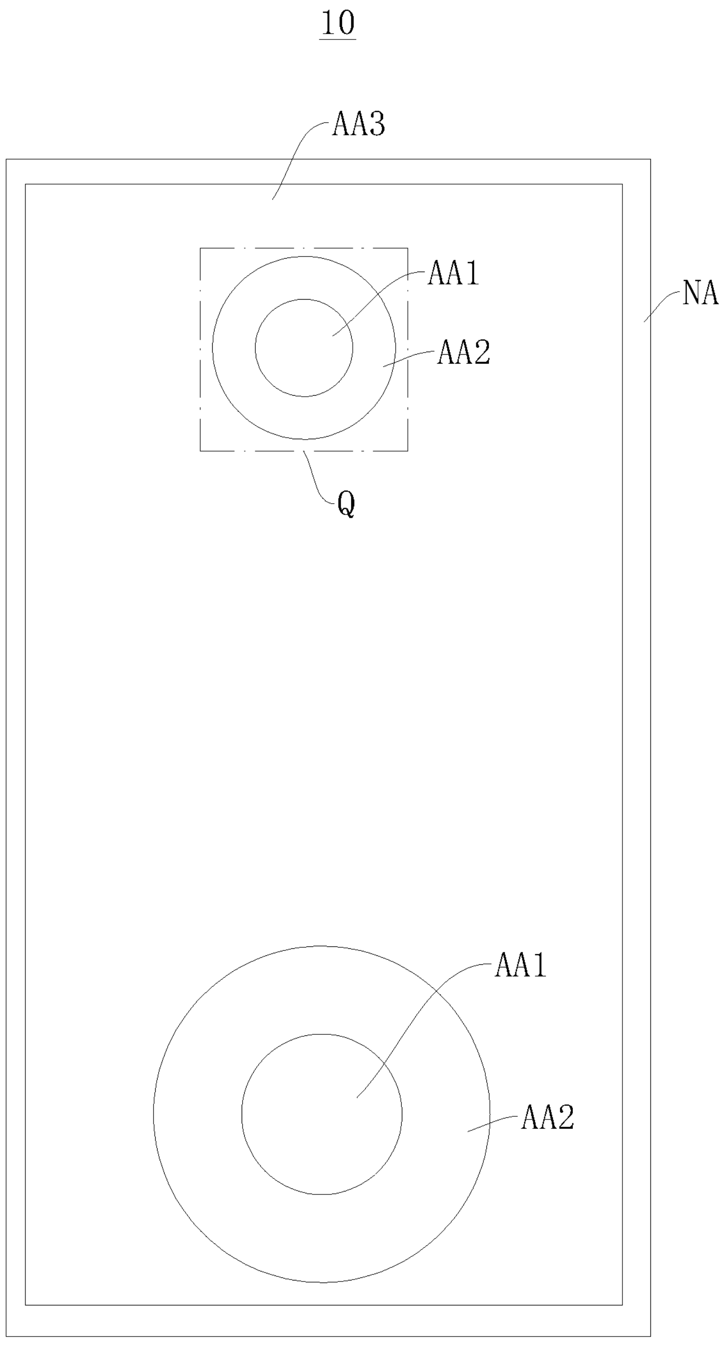
FIG. 1 shows a schematic structural diagram of a display panel according to embodiments of the first aspect of the present application.

FIG. 1 shows a top view of a display panel 10 according to an embodiment of the present application.

As shown in FIG. 1, the display panel 10 includes a first display area AA1, a transition display area AA2, a second display area AA3, and a non-display area NA surrounding the first display area AA1, the transition display area AA2 and the second display area AA3, the light transmittance of the first display area AA1 is greater than the light transmittance of the transition display area AA2. Optionally, the light transmittance of the first display area AA1 is greater than the light transmittance of the second display area AA3.

In the present application, the light transmittance of the first display area AA1 is greater than or equal to 15%. In order to ensure that the light transmittance of the first display area AA1 is greater than 15%, or even greater than 40%, or even a higher light transmittance, the light transmittances of various functional films of the display panel 10 in the embodiment are all greater than 80%, and even the light transmittances of at least part of the functional films are all greater than 90%.

According to the display panel 10 of the embodiments of the present application, the light transmittance of the first display area AA1 is greater than the light transmittance of the transition display area AA2, so that the photosensitive component may be integrated on the rear of the first display area AA1 of the display panel 10. An under-screen integration is achieved for the photosensitive component such as a camera, and moreover, the first display area AA1 can display the image, the display area of the display panel 10 is increased and a full-screen design is achieved for the display apparatus.

The number of the first display area AA1 and the transition display area AA2 may be set in a variety of ways, for example, the number of the first display area AA1 and the transition display area AA2 is one, so as to achieve under-screen integration for the photosensitive component and fingerprint recognition. Alternatively, in some other optional embodiments, the number of the first display area AA1 and the transition display area AA2 is two, in which one set of the first display area AA1 and the transition display area AA2 is used for under-screen integration for the photosensitive component, and the other set of the first display area AA1 and the transition display area AA2 is used for fingerprint recognition.

Figure 2:
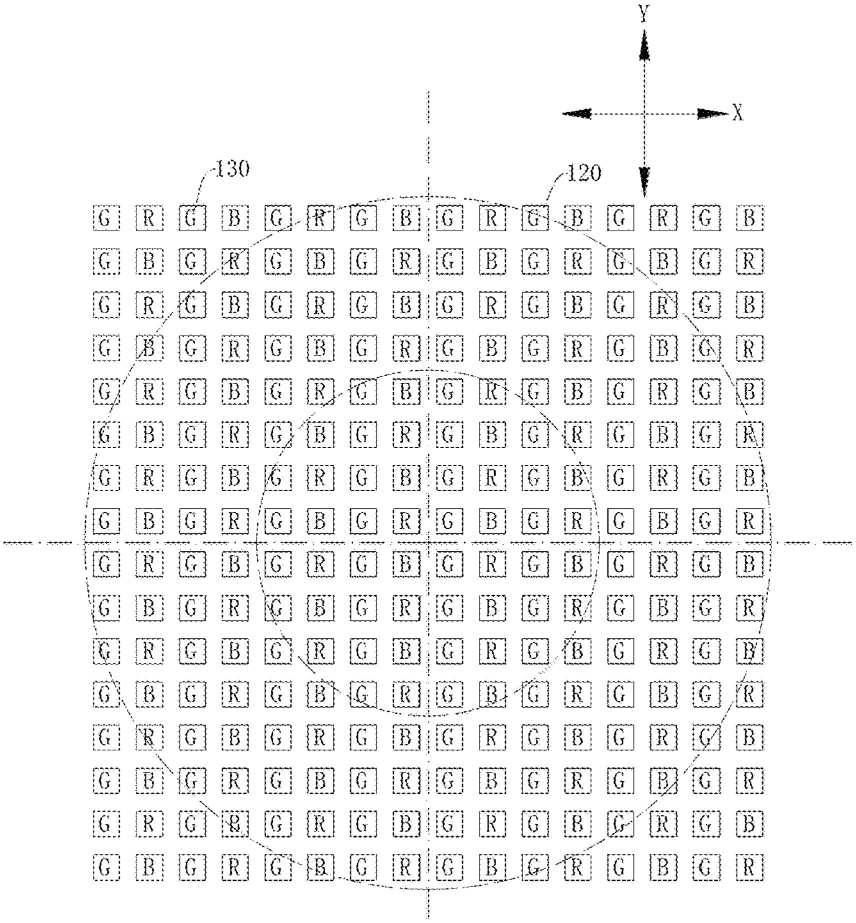
FIG. 2 shows a partially enlarged diagram of area Q in FIG. 1 in an example.
Figure 3:
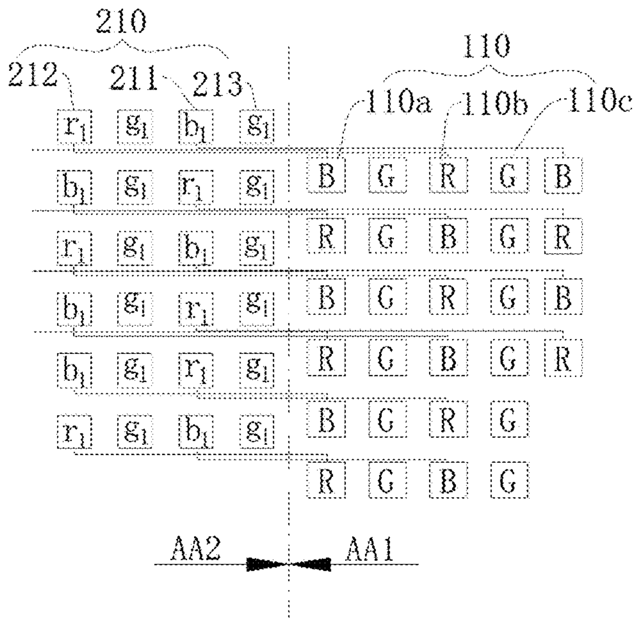
FIG. 3 shows a schematic diagram of local detail of FIG. 2 in an example.

Referring to FIGS. 2 and 3 together, FIG. 2 shows a partially enlarged schematic structural diagram of area Q in FIG. 1, and FIG. 3 shows a partially enlarged schematic structural diagram of FIG. 2.

As shown in FIGS. 2 and 3, the display panel 10 according to the embodiments of the present application includes: first pixel units 110 located in the first display area AA1 and each including a first sub-pixel 110*a*, a second sub-pixel 110*b*, and a third sub-pixel 110*c*, the first sub-pixels 110*a*, the second sub-pixels 110*b* and the third sub-pixels 110*c* being arranged in an array; and first pixel circuits 210 located in the transition display area AA2 and each including a first circuit 211 for driving the first sub-pixel 110*a*, a second circuit 212 for driving the second sub-pixel 110*b* and a third circuit 213 for driving the third sub-pixel 110*c*, the first circuits 211, the second circuits 212 and the third circuits 213 being arranged in an array in the transition display area AA2, in which the first pixel circuits 210 for driving the first pixel units 110 in a same column are located in at least two adjacent columns, and an arrangement pattern of the first circuits 211 and the second circuits 212 is the same as an arrangement pattern of the first sub-pixels 110*a* and the second sub-pixels 110*b* respectively driven by the first circuits 211 and the second circuits 212.

Optionally, an arrangement pattern of the first circuits 211, the second circuits 212 and the third circuits 213 is the same as an arrangement pattern of the first sub-pixels 110*a*, the second sub-pixels 110*b* and the third sub-pixels 110*c* respectively driven by the first circuits 211, the second circuits 212 and the third circuits 213.

According to the display panel 10 of the embodiments of the first aspect of the present application, the first pixel circuits 210 for driving the first pixel units 110 are located in the transition display area AA2, wiring in the first display area AA1 can be reduced to increase the light transmittance of the first display area AA1. The first pixel unit 110 includes the first sub-pixel 110*a*, the second sub-pixel 110*b* and the third sub-pixel 110*c*, through which the display panel 10 displays a color image. The first pixel circuit 210 includes the first circuit 211 for driving the first sub-pixel 110*a*, the second circuit 212 for driving the second sub-pixel 110*b*, and the third circuit 213 for driving the third sub-pixel 110*c*, through which the first sub-pixel 110*a*, the second sub-pixel 110*b*, and the third sub-pixel 110*c* are driven to display. In addition, the first pixel circuits 210 for driving the first pixel units 110 in a same column are located in at least two adjacent columns, so that a plurality of the first pixel circuits 210 can be arranged surrounding the first display area AA1, the space between the first pixel circuit 210 and the first pixel unit 110 driven by the first pixel circuit 210 is reduced. The arrangement pattern of the first circuits 211, the second circuits 212 and the third circuits 213 is the same as the arrangement pattern of the first sub-pixels 110*a*, the second sub-pixels 110*b* and the third sub-pixels 110*c* respectively driven by the first circuits 211, the second circuits 212 and the third circuits 213, wiring of the display panel 10 can be simplified, a disordered image display due to the non-correspondence between the first pixel unit 110 and the first pixel circuit 210 is avoided, and the control accuracy and the display effect of the display panel 10 are improved.

In the embodiments of the present application, the arrangement pattern of the first circuits 211, the second circuits 212 and the third circuits 213 being the same as the arrangement pattern of the first sub-pixels 110*a*, the second sub-pixels 110*b* and the third sub-pixels 110*c* respectively driven by the first circuits 211, the second circuits 212 and the third circuits 213 means that, for example, the first sub-pixels 110*a* and the second sub-pixels 110*b* are alternately arranged along a second direction to form first pixel columns, the first circuits 211 and the second circuits 212 are arranged along the second direction to form first circuit columns, and the first circuits 211 and the second circuits 212 for driving the first pixel column are alternately arranged along the second direction and located in two adjacent first circuit columns. In the present application, for example, the second direction Y is the column direction, and the first direction X is the row direction.

As shown in FIG. 3, if two adjacent first pixel columns are staggered so that the first sub-pixels 110*a* and the second sub-pixels 110*b* are alternately arranged along the first direction, the first circuits 211 and the second circuits 212 for driving the first pixel column are alternately arranged along the second direction and located in two adjacent first circuit columns, causing that the arrangement pattern of the first circuit columns is different from the arrangement pattern of the first pixel columns.

In some other embodiments, for example, a plurality of the third sub-pixels 110*c* are arranged along the second direction to form second pixel columns, the third circuits 213 are arranged along the second direction to form second circuit columns, and the third circuits 213 for driving the second pixel column are arranged along the second direction and located in two adjacent second circuit columns.

As shown in FIG. 3, since the second pixel column includes only the third sub-pixels 110*c* and the second circuit column includes only the third circuits 213, even though the third circuits 213 for driving a same second pixel column are located in two adjacent second circuit columns, the arrangement pattern of the second circuit columns is still the same as the arrangement pattern of the second pixel columns.

Figure 4:
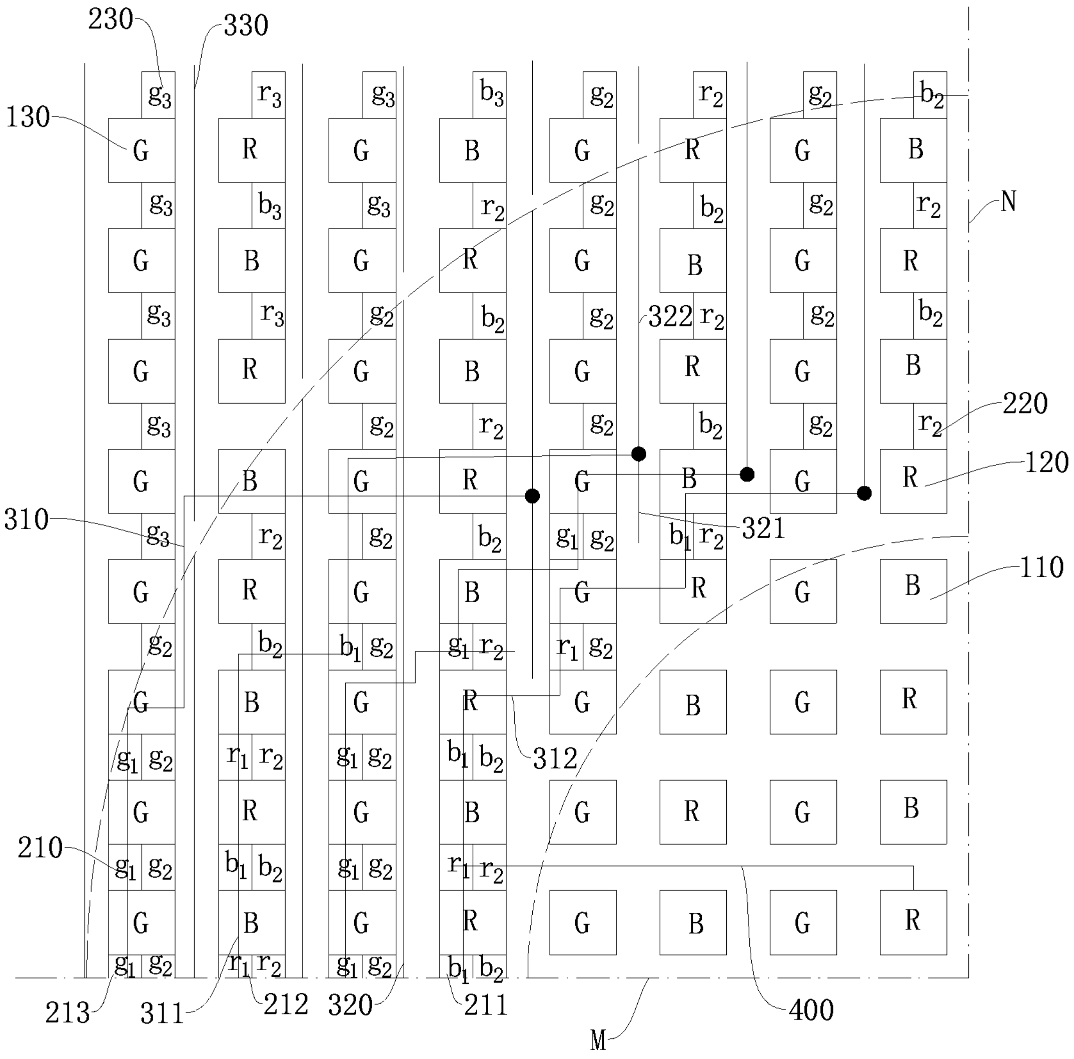
FIG. 4 shows a partially enlarged schematic structural diagram of FIG. 2 in another example.
Figure 5:
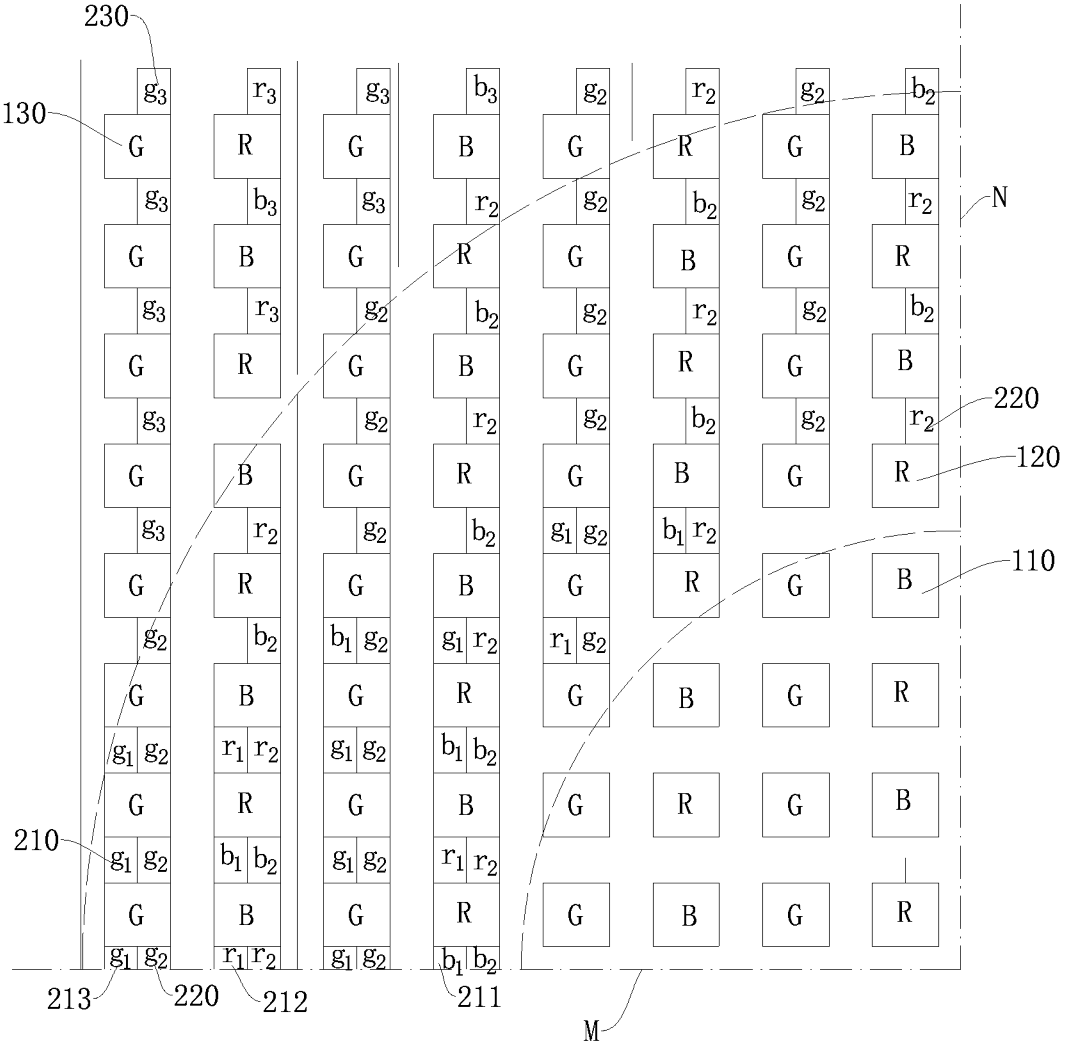
FIG. 5 shows a partially enlarged schematic structural diagram of FIG. 2 in yet another example.

Referring to FIGS. 4 and 5 together, FIG. 4 shows a partially enlarged schematic structural diagram of FIG. 2 according to another embodiment, and FIG. 5 shows a detailed schematic structural diagram of FIG. 4 in which some of the signal lines are omitted.

In FIGS. 4 and 5, B in the first display area AA1 denotes the first sub-pixel 110*a*, and b1 in the transition display area AA2 denotes the first circuit 211 for driving the first sub-pixel 110*a*; R in the first display area AA1 denotes the second sub-pixel 110*b*, and r1 in the transition display area AA2 denotes the second circuit 212 for driving the second sub-pixel 110*b*; and G in the first display area AA1 denotes the third sub-pixel 110*c*, and g1 in the transition display area AA2 denotes the third circuit 213 for driving the third sub-pixel 110*c*.

In some other optional embodiments, for example, the first sub-pixels 110*a* and the second sub-pixels 110*b* are alternately arranged along the second direction to form the first pixel columns, the third sub-pixels 110*c* are arranged along the second direction to form the second pixel columns, and the first pixel columns and the second pixel columns are alternately arranged along the first direction. The first pixel circuits 210 for driving the first pixel units 110 in a same column are located in at least two adjacent columns, the first circuits 211 and the second circuits 212 are arranged along the second direction to form the first circuit columns, and the third circuits 213 are arranged in sequence along the second direction to form the second circuit columns. When the first pixel circuits 210 for driving the first pixel units 110 in a same column are located in at least two adjacent columns, the first circuit columns and the second circuit columns may be located in a same column of the first pixel circuits 210, provided that the first circuits 211 and the second circuits 212 for driving the first pixel column are alternately arranged in sequence along the second direction and the third circuits 213 for driving the second pixel column are arranged in sequence along the second direction, so that the arrangement pattern of the first circuits 211, the second circuits 212 and the third circuits 213 is the same as the arrangement pattern of the first sub-pixels 110*a*, the second sub-pixels 110*b* and the third sub-pixels 110*c* respectively driven by the first circuits 211, the second circuits 212 and the third circuits 213. The first circuits 211 and the second circuits 212 for driving the first pixel column may be located in two columns of the first pixel circuits 210, and the third circuits 213 for driving the second pixel column may also be located in two columns of the first pixel circuits 210. In some optional embodiments, the first circuit 211 and the first sub-pixel 110*a* driven by the first circuit 211 are arranged in a same layer, the second circuit 212 and the second sub-pixel 110*b* driven by the second circuit 212 are arranged in a same layer, and the third circuit 213 and the third sub-pixel 110*c* driven by the third circuit 213 are arranged in a same layer. The wiring of the display panel 10 can be simplified, and the preparation efficiency of the display panel 10 is improved.

In some optional embodiments, as shown in FIG. 4, the display panel further includes signal lines including first signal lines 310 located in the transition display area AA2, the first signal line 310 is connected to a plurality of first pixel circuits 210 for driving the first pixel units 110 in a same column, in which the plurality of first pixel circuits 210 for driving the first pixel units 110 in a same column are located in at least two columns adjacent along the first direction and at least two rows adjacent along the second direction, the first signal line 310 includes a first segment 311 and a second segment 312 connected successively, the first segment 311 is configured to connect the first pixel circuits 210 located in different rows, the second segment 312 is configured to connect the first pixel circuits 210 located in different columns, and a material of the second segment 312 includes a transparent material.

For the plurality of first pixel circuits 210 for driving the first pixel units 110 in a same column, the plurality of first pixel circuits 210 may be configured to drive the first pixel units 110 in one column, or the first pixel units 110 in the same two or more columns.

According to the display panel 10 of the embodiments of the first aspect of the present application, the first signal line 310 connecting the first pixel circuits 210 is located in the transition display area AA2, the wiring in the first display area AA1 can be reduced and the light transmittance of the first display area AA1 is increased. The first signal line 310 includes the first segment 311 and the second segment 312 connected successively, the first segment 311 is configured to connect the first pixel circuits 210 located in different rows in the second direction, then the first segment 311 extends along the second direction. The second segment 312 is configured to connect the first pixel circuits 210 located in different columns in the first direction, then the second segment 312 extends along the first direction. The material of the second segment 312 includes a transparent material, which can reduce the display difference between the second display area AA3 and the transition display area AA2 due to the bending of the first signal line 310 and improve the display effect of the display panel 10.

In the embodiments of the present application, for example, the signal line is a data line. In other embodiments, the signal line may be a scanning line.

The plurality of first pixel circuits 210 for driving the first pixel units 110 in a same column are located in at least two columns adjacent along the first direction and at least two rows adjacent along the second direction, there may be one or more first pixel circuits 210 in a same row, and there may be one or more first pixel circuits 210 in a same column.

For example, when the first pixel circuit 210 and the first pixel unit 110 connected with the first pixel circuit 210 are arranged in a same row, the two first pixel circuits 210 connected by the second segment 312 are located in two adjacent columns. In other cases, the two first pixel circuits 210 connected by the second segment 312 may be located in two adjacent columns or two non-adjacent columns. For the plurality of first pixel circuits 210 for driving the first pixel units 110 in a same column, there is one first pixel circuit 210 in a same row, and there are one or more first pixel circuits 210 in a same column.

The data lines corresponding to the pixel units in the transition display area AA2 and the second display area AA3 are usually formed by extending along the second direction, while the first signal lines 310 corresponding to the pixel units in the first display area AA1 are formed by extending along a bending path. The first segment 311 of the first signal line 310 is arranged parallel to the data lines corresponding to the pixel units in the transition display area AA2 and the second display area AA3, while the second segment 312 is arranged crossing the data lines corresponding to the pixel units in the transition display area AA2 and the second display area AA3. If the first segment 311 and the second segment 312 are made of the same material (e.g., metal) as the data lines corresponding to the pixel units in the transition display area AA2 and the second display area AA3, the display effect of the transition display area AA2 will be different from that of the second display area AA3. In the embodiments of the present application, the material of the second segment 312 includes a transparent material, which can reduce the display difference between the second display area AA3 and the transition display area AA2 due to the bending of the first signal line 310 and improve the display effect of the display panel 10.

In addition, for the plurality of first pixel circuits 210 for driving the first pixel units 110 in a same column, at least two adjacent first pixel circuits 210 are distributed along the first direction, and at least two adjacent first pixel circuits 210 are distributed along the second direction, i.e., the first pixel circuits 210 located in at least two adjacent rows and corresponding to the first pixel units 110 in a same column are staggered, in which case the first signal line 310 extends along a step-like bending path and includes the first segment 311 and a second segment 312. With such a configuration, not only the first signal line 310 can be connected to the plurality of first pixel circuits 210 corresponding to the first pixel units 110 in a same column, but also two adjacent first signal lines 310 do not cross each other, ensuring that the adjacent first signal lines 310 are insulated from each other.

Figure 6:
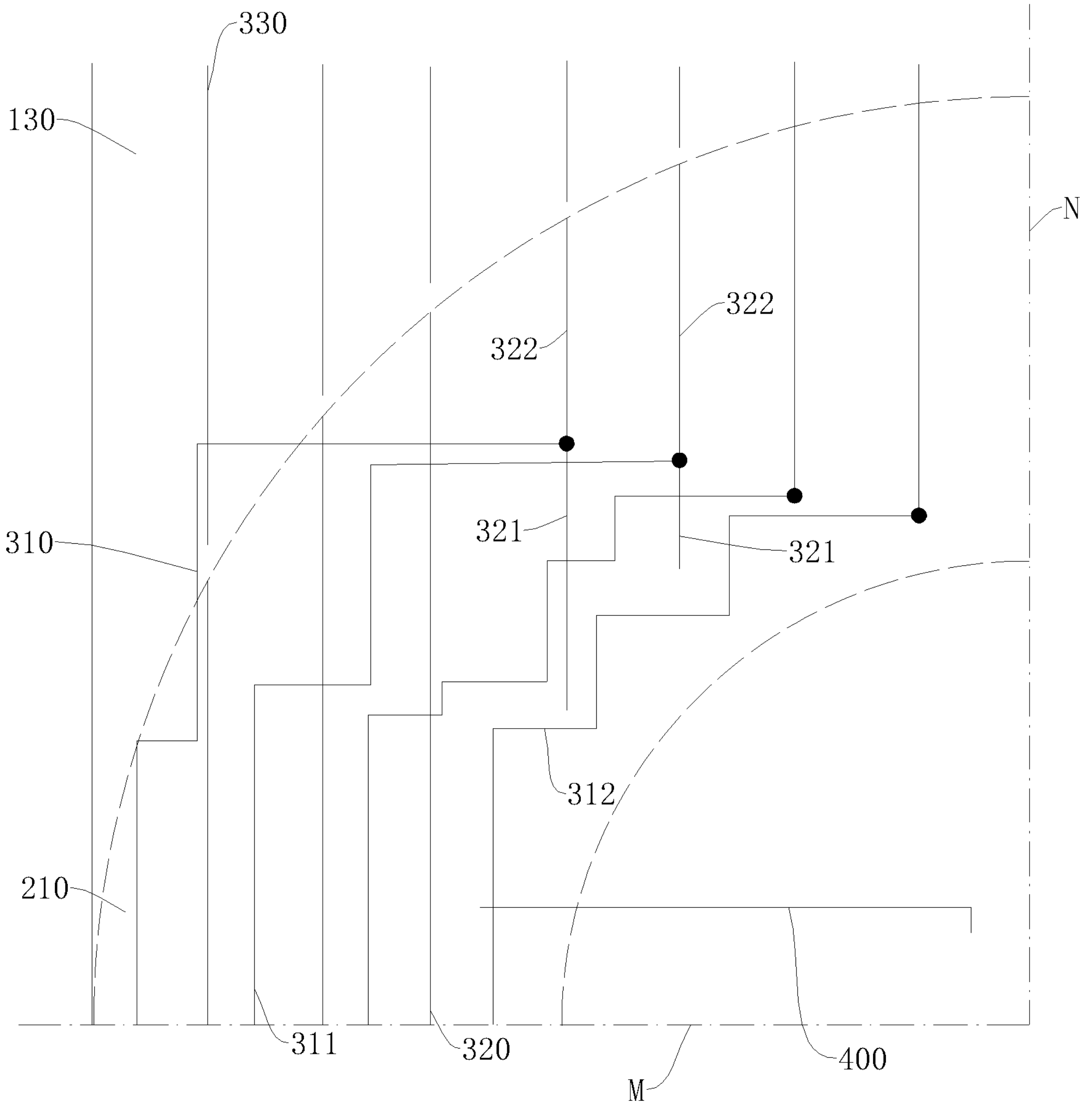
FIG. 6 shows a partially enlarged schematic structural diagram of FIG. 2 in yet another example.

Referring to FIG. 6, which shows a schematic structural diagram of a part of FIG. 4. In order to show the structure of the first signal line 310 more clearly, the pixel circuit and the pixel unit are not illustrated in FIG. 6.

In some optional embodiments, as shown in FIGS. 4 and 6, the plurality of pixel units further include transition pixel units 120 located in the transition display area AA2, the pixel circuits further include transition pixel circuits 220 located in the transition display area AA2 and configured to drive the transition pixel units 120, and the signal lines further include transition signal lines 320 located in the transition display area AA2, the transition signal line 320 is connected to a plurality of transition pixel circuits 220 for driving the transition pixel units 120 in a same column, and the first signal line 310 and the transition signal line 320 corresponding to the first pixel unit 110 and the transition pixel unit 120 located in a same column are connected to each other.

In FIG. 4, for example, R, G, and B in the transition display area AA2 donate the transition pixel units 120, and r2, g2, and b2 in the transition display area AA2 donate the transition pixel circuits 220 for driving the transition pixel units 120.

Optionally, the transition pixel circuit 220 is arranged correspondingly to the transition pixel unit 120 driven by the transition pixel circuit 220, and the first pixel circuit 210 and the transition pixel circuit 220 are arranged at positions corresponding to a same transition pixel unit 120, i.e., in the transition display area AA2, some of the individual transition pixel units 120 are provided correspondingly with two pixel circuits, that is, some of the individual transition pixel units 120 are provided correspondingly with the transition pixel circuit 220 and the first pixel circuit 210.

The extending path of the transition signal line 320 may be set in a variety of ways, and optionally, the transition signal line 320 is formed by extending along a straight path to facilitate the preparation of the transition signal line 320. Then as shown in FIG. 4, the signal line passing through the transition display area AA2 and in a straight line is the transition signal line 320, and the signal line passing through the transition display area AA2, in a bending shape, and including the first segment 311 and the second segment 312 is the first signal line 310.

For a plurality of transition pixel circuits 220 for driving the transition pixel units 120 in a same column, the plurality of transition pixel circuits 220 may be configured to drive the transition pixel units 120 in one column, or the transition pixel units 120 in the same two or more columns. In these optional embodiments, the first signal lines 310 and the transition signal lines 320 corresponding to the first pixel units 110 and the transition pixel units 120 in a same column are connected to each other, and the first pixel units 110 and the transition pixel units 120 in a same column may be driven using a same column of drive signals.

In some optional embodiments, for the first signal line 310 and the transition signal line 320 corresponding to the first pixel unit 110 and the transition pixel unit 120 located in a same column, the transition signal line 320 is located on at least one side of the first pixel unit 110 in the column in the second direction, and the first signal line 310 extends along a bending path and is connected to the transition signal line 320.

In these optional embodiments, the transition signal line 320 is located on one side of the first pixel unit 110 in the column, the first signal line 310 is located on one side of the first pixel unit 110 in the column in the first direction, the first signal line 310 can be connected to the transition signal line 320 after extending along the bending path, and the first pixel unit 110 and the transition pixel unit 120 located in the column can be driven by a same signal, column-by-column driving is achieved.

Optionally, the transition display area AA2 includes a plurality of annular areas surrounding a circumference of the first display area AA1 and being distributed concentrically with the first display area AA1, the first pixel circuit 210 and the first pixel unit 110 connected to the first pixel circuit 210 are arranged in a same row, and the first pixel circuits 210 for driving the first pixel units 110 in a same column are distributed in sequence within a same annular area.

According to the display panel 10 of the embodiments of the first aspect of the present application, the first pixel circuits 210 for driving the first pixel units 110 in a same column are distributed in sequence within a same annular area, so that the first signal lines 310 corresponding to the first pixel units 110 in a same column can be connected to the first pixel circuits 210 in sequence within the annular area. Since the first pixel circuits 210 corresponding the first pixel units 110 in different columns are located in different annular areas, different first signal lines 310 extend within different annular areas to connect to the first pixel circuits 210, therefore two adjacent first signal lines 310 do not cross each other and signal crosstalk can be avoided.

In some optional embodiments, as shown in FIGS. 4 and 6, the display panel 10 further includes a connecting wire 400, the first pixel circuit 210 and the first pixel unit 110 connected to the first pixel circuit 210 are arranged in a same row, the connecting wire 400 extends in the first direction and is configured to connect the first pixel unit 110 and the first pixel circuit 210, and a material of the connecting wire 400 includes a transparent material. FIGS. 4 and 6 merely exemplarily illustrate one of the connections between the first pixel units 110 and the first pixel circuits 210, and in the embodiments as shown in FIGS. 4 and 6, the first pixel circuits 210 and the first pixel units 110 may be arranged with a one-to-one correspondence.

In these optional embodiments, the connecting wire 400 is provided to connect the first pixel circuit 210 and the first pixel unit 110. A part of the connecting wire 400 is located in the first display area AA1, and another part of the connecting wire 400 is located in the transition display area AA2. The connecting wire 400 in the transition display area AA2 is redundant relative to the second display area AA3, the transition display area AA2 includes a part of the connecting wire 400, but the second display area AA3 does not include the connecting wire 400, which may cause display difference between the transition display area AA2 and the second display area AA3. The material of the connecting wire 400 includes a transparent material, which can increase the light transmittance of the first display area AA1 and reduce the display difference between the transition display area AA2 and the second display area AA3.

Optionally, the connecting wire 400 and the second segment 312 are arranged in a same layer, so as to simplify the preparation process of the display panel 10 and improve the preparation efficiency of the display panel 10.

Figure 7:
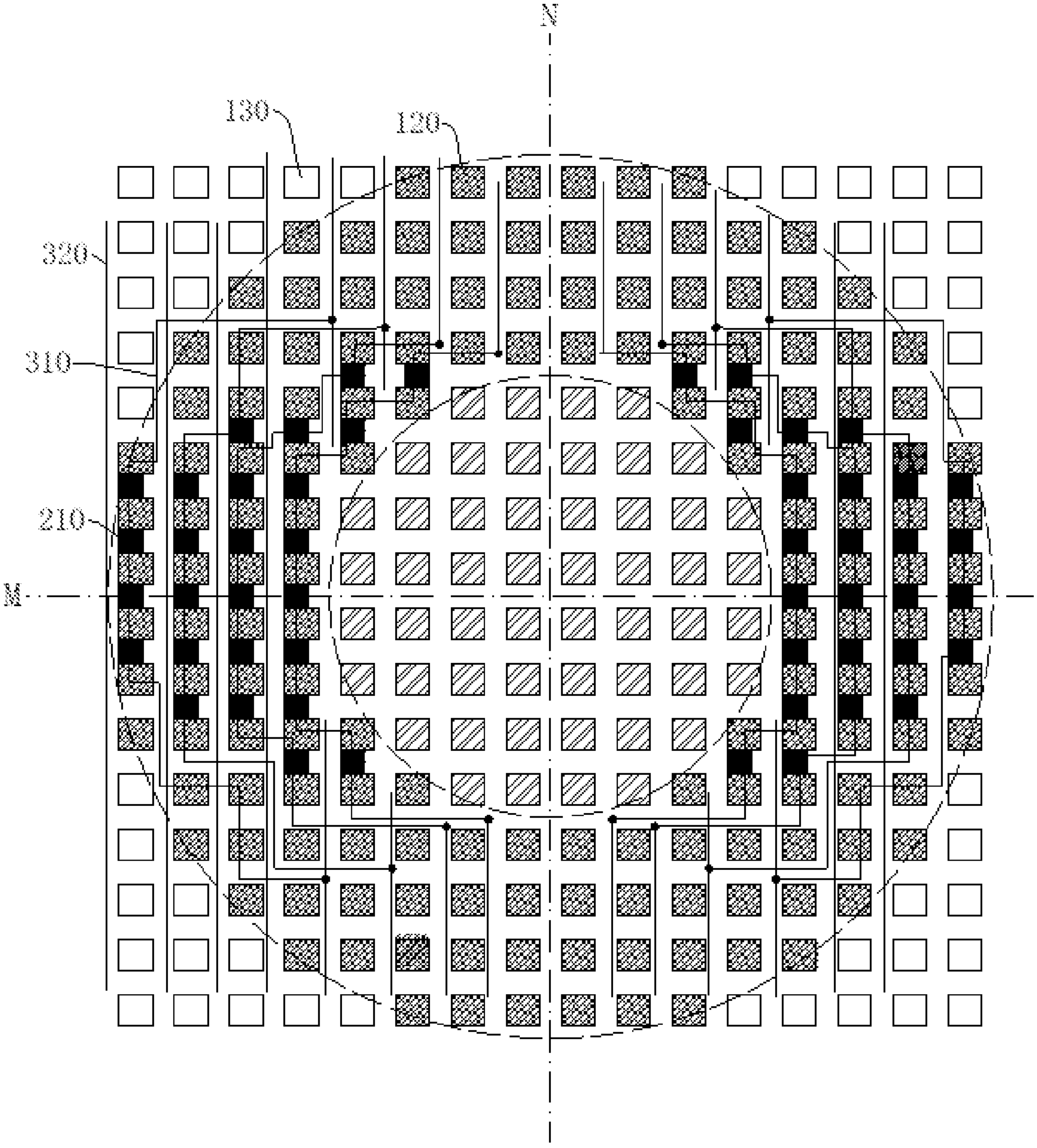
FIG. 7 shows a partially enlarged diagram of area Q in FIG. 1 in another example.

The first signal line 310 and the transition signal line 320 may be arranged in a variety of ways, and in some optional embodiments, referring to FIG. 7, which shows a partially enlarged schematic structural diagram of area Q in FIG. 1 in another embodiment. In order to better illustrate the structure of the first pixel circuit 210, the transition pixel circuit 220 is omitted in FIG. 7.

FIGS. 4 and 7 illustrate one of the positions of the first signal line 310 and the transition signal line 320. The first signal line 310 and the transition signal line 320 may be arranged at other positions, provided that the first signal line 310 can be connected to the first pixel circuit 210 and the transition signal line 320 can be connected to the transition pixel circuit 220.

Optionally, if the first display area AA1 includes two or more columns of the first pixel units 110, the first pixel circuits 210 connected to the two or more columns of the first pixel units 110 may be located in different annular areas.

In some other optional embodiments, as shown in FIGS. 4 to 7, the first display area AA1 is arranged symmetrically about a second axis of symmetry N, the second axis of symmetry N extends along the second direction and passes through a center of the first display area AA1, the first pixel circuits 210 corresponding to two columns of first pixel units 110 distributed symmetrically about the second axis of symmetry N are located in a same annular area, and the first pixel circuit 210 is located at a side of the first pixel unit 110 connected to the first pixel circuit 210 away from the second axis of symmetry N.

In these optional embodiments, the first pixel circuits 210 corresponding to two columns of first pixel units 110 distributed symmetrically about the second axis of symmetry N are located in a same annular area, and the first pixel circuit 210 is located at a side of the first pixel unit 110 connected to the first pixel circuit 210 away from the second axis of symmetry N. Therefore, the first pixel circuits 210 corresponding to two columns of first pixel units 110 distributed symmetrically about the second axis of symmetry are arranged on two sides of the second axis of symmetry N, and these first pixel circuits 210 do not cross each other even if they are located in a same annular area. Moreover, in the embodiments of the present application, the first pixel circuits 210 are arranged more regularly and easily, and the distribution of the first pixel circuits 210 is more uniform, which can reduce uneven color rendering of the display panel 10.

Optionally, two transition signal lines 320 for connecting the first pixel circuits 210 in a same annular area are distributed symmetrically about the second axis of symmetry N. Since the first pixel circuits 210 corresponding to two columns of first pixel units 110 distributed symmetrically about the second axis of symmetry N are located in a same annular area, there are two columns of first pixel circuits 210 corresponding to the first pixel units 110 in the same annular area, and two first signal lines 310 are required to connect these first pixel circuits 210. The two first signal lines 310 are distributed relative to the second axis of symmetry N to facilitate the wiring setup and the interconnection of the first pixel circuits 210 and the first signal lines 310.

Optionally, a plurality of first pixel circuits 210 are arranged symmetrically about the second axis of symmetry N, therefore the arrangement of the plurality of first pixel circuits 210 is more uniform, uneven color rendering of the display panel 10 can be further reduced.

Optionally, a plurality of first pixel circuits 210 are arranged symmetrically about a first axis of symmetry M extending along the first direction and passing through the center of the first display area AA1.

The shape of the first display area AA1 may be set in a variety of ways, for example, the first display area AA1 may be regular polygonal or round in shape. In the embodiments of the present application, for example, the first display area AA1 is round in shape. In other embodiments, the first display area AA1 may be oval or regular polygonal in shape, and the regular polygon may be, for example, a square, an equilateral triangle, etc.

If the first display area AA1 is round in shape, the annular area extends in annulus along an edge of the first display area AA1, a plurality of first pixel circuits 210 are distributed in rows and columns, and for at least two adjacent rows of the first pixel circuits 210, the number of the first pixel circuits 210 in one row is greater than the number of the first pixel circuits 210 in the other row.

In these optional embodiments, if the first display area AA1 is round in shape, for at least two adjacent rows of the first pixel units 110, the number of the first pixel units 110 in one row is greater than the number of the first pixel units 110 in the other row, so that the arrangement pattern of the first pixel circuits 210 fits the arrangement pattern of the first pixel units 110, and the arrangement of the first pixel circuit 210 is more reasonable.

Optionally, for a plurality of first pixel circuits 210 located in different rows and corresponding to the first pixel units 110 in a same column, some of the adjacent first pixel circuits 210 are staggered.

In some embodiments, a pixel circuit structure of the first pixel circuit 210 is any one of a 2T1C circuit, a 7T1C circuit, a 7T2C circuit, or a 9T1C circuit. In the present application, the "2T1C circuit" refers to a pixel circuit including two thin-film transistors (T) and one capacitor (C), and the same applies to "7T1C circuit", "7T2C circuit", "9T1C circuit", and so on.

Optionally, a circuit structure of the transition pixel circuit 220 is any one of a 2T1C circuit, a 7T1C circuit, a 7T2C circuit, or a 9T1C circuit.

Optionally, the transition display area AA2 is an annulus surrounding the first display area AA1, and the transition display area AA2 includes a plurality of annular areas spaced uniformly in a direction away from the center of the first display area AA1.

In these optional embodiments, the annular areas being spaced uniformly means that the widths of the plurality of annular areas are the same. For example, if the annular area includes two edges being spaced apart, the minimum distances between the two edges of the various annular areas are the same. If the first pixel circuits 210 are distributed within the plurality of annular areas spaced uniformly, the distribution of the plurality of first pixel circuits 210 is more balanced and the display effect of the display panel 10 is more uniform.

As shown in FIG. 7, for example, the first display area AA1 is round in shape and includes eight rows and eight columns of the first pixel units 110. The eight rows and eight columns of the first pixel units 110 are distributed symmetrically about both the first axis of symmetry M and the second axis of symmetry N. The first pixel circuits 210 for driving the first pixel units 110 are arranged on two sides of the second axis of symmetry N and symmetrically about the second axis of symmetry N.

The transition display area AA2 includes four annular areas, and a plurality of first pixel circuits 210 arranged symmetrically about the second axis of symmetry N are located in a same annular area. The first pixel circuits 210 for driving the first pixel units 110 in the first column from the left in FIG. 7 and the first pixel circuits 210 for driving the first pixel units 110 in the eighth column from the left in FIG. 7 are located in a same annular area which is farthest from the first display area AA1. The first pixel circuits 210 for driving the first pixel units 110 in the fourth column from the left in FIG. 7 and the first pixel circuits 210 for driving the first pixel units 110 in the fifth column from the left in FIG. 7 are located in a same annular area which is nearest from the first display area AA1.

Optionally, for example, the first pixel units 110 in the first column from the left in FIG. 7 form the second pixel column which includes four third sub-pixels 110*c* arranged along the second direction, then the first pixel units 110 in the second column from the left form the first pixel column which includes the first sub-pixels 110*a* and the second sub-pixels 110*b* arranged alternately along the second direction, the third column from the left is the second pixel column, and the fourth column from the left is the first pixel column. The fifth column from the left is the second pixel column, the sixth column from the left is the first pixel column, the seventh column from the left is the second pixel column, and the eighth column from the left is the first pixel column.

Herein, two adjacent first pixel columns are staggered, i.e., in FIG. 7, the first pixel column of the fourth column from the left and the first pixel column of the second column from the left are staggered, so that the first sub-pixels 110*a* in the first pixel column of the fourth column from the left and the second sub-pixels 110*b* in the second column from the left are arranged correspondingly along the first direction, and the second sub-pixels 110*b* in the fourth column from the left and the first sub-pixels 110*a* in the second column from the left are arranged correspondingly along the first direction. The first pixel column of the sixth column from the left and the first pixel column of the fourth column from the left are staggered, and the first pixel column of the sixth column from the left and the first pixel column of the second column from the left are aligned along the first direction. The first pixel column of the eighth column from the left and the first pixel column of the sixth column from the left are staggered, and the first pixel column of the eighth column from the left and the first pixel column of the fourth column from the left are aligned along the first direction.

Since the first pixel circuits 210 are distributed along the annular areas in the transition display area AA2, the first pixel circuit 210 columns corresponding to some first pixel unit 110 columns are arranged in two adjacent columns. For example, the first circuits 211 and the second circuits 212 corresponding to the first pixel column of the second column from the left are located in two adjacent columns of the first pixel circuits 210, the third circuits 213 corresponding to the second pixel column of the third column from the left are located in three adjacent columns of the first pixel circuits 210, and the first circuits 211 and the second circuits 212 corresponding to the first pixel column of the fourth column from the left are located in three adjacent columns of the first pixel circuits 210.

Since the first display area AA1 is round in shape, numbers of the first pixel units 110 in at least two adjacent rows are different. For example, in the first display area AA1, as shown in FIG. 7, the number of the first pixel units 110 in the first row from the top is less than the number of the first pixel units 110 in the second row. Then, the number of the first pixel circuits 210 corresponding to the first pixel units 110 in the first row is less than the number of the first pixel circuits 210 in the second row, and the first pixel circuits 210 corresponding to the first pixel units 110 in the first row and the first pixel circuits 210 in the second row are staggered in the first direction.

In some optional embodiments, as shown in FIGS. 2 and 4, the plurality of pixel units further include second pixel units 130 located in the second display area AA3, the display panel further incudes second pixel circuits 230 for driving the second pixel units 130 and located in the second display area AA3, the signal lines further include second signal lines 330 located in the second display area AA3, the second signal line 330 is connected to a plurality of second pixel circuits 230 for driving the second pixel units 130 in a same column, in which a ratio between a column number of the second pixel units 130 and a number of the second signal lines 330 is a first ratio, and a ratio between a column number of the transition pixel units 120 and a sum of numbers of the first signal lines 310 and the transition signal lines 320 is a second ratio equal to the first ratio.

In these optional embodiments, the first ratio is equal to the second ratio. For example, when the first ratio is 1, i.e., a column of the second pixel units 130 corresponds to one second signal line 330, the second ratio is also 1, i.e., a column of the transition pixel units 120 corresponds to one first signal line 310 or one transition signal line 320, which can further reduce the display difference between the transition display area AA2 and the second display area AA3 and improve the display effect of the display panel 10.

Optionally, if some of the second pixel units 130 and the transition pixel units 120 are located in a same column, the second signal lines 330 and the transition signal lines 320 corresponding to the second pixel units 130 and the transition pixel units 120 in the same column are connected end to end. Alternatively, the second signal lines 330 and the transition signal lines 320 corresponding to the second pixel units 130 and the transition pixel units 120 in the same column are distributed in sequence along the second direction.

In some optional embodiments, in order to ensure the control accuracy, the second pixel units 130 and the second pixel circuits 230 are arranged with a one-to-one correspondence, then a column of the second pixel units 130 corresponds to one second signal line 330. However, the transition display area AA2 is provided with the first signal line 310 corresponding to the first pixel unit 110 and the transition signal line 320 corresponding to the transition pixel unit 120, in order that a column of the transition pixel units 120 corresponds to one first signal line 310 or one transition signal line 320, two or more first pixel units 110 are connected to a same first pixel circuit 210, and/or two or more transition pixel units 120 are connected to a same transition pixel circuit 220.

Figure 8:
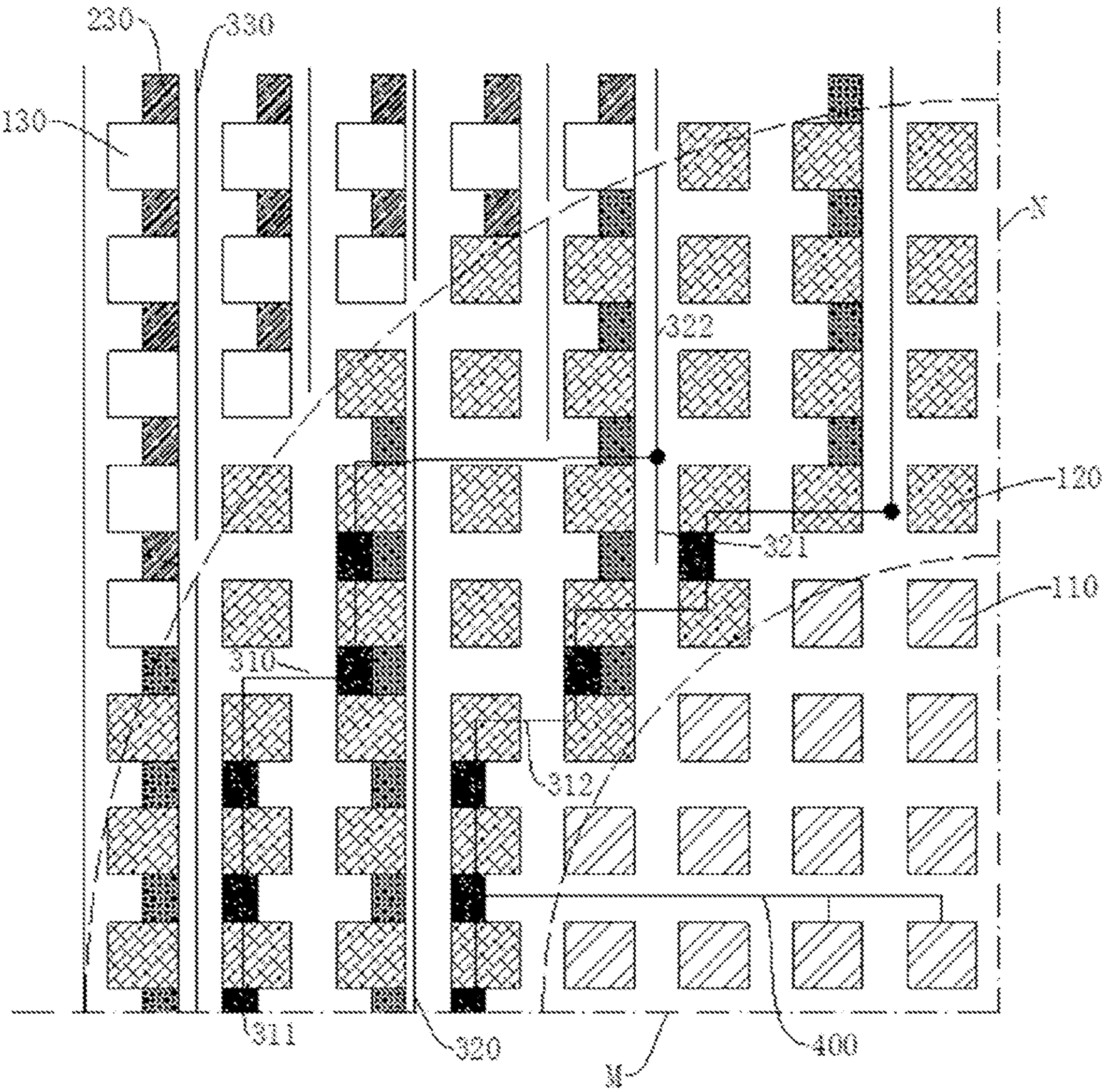
FIG. 8 shows a partially enlarged schematic structural diagram of FIG. 2 in yet another example.
Figure 9:
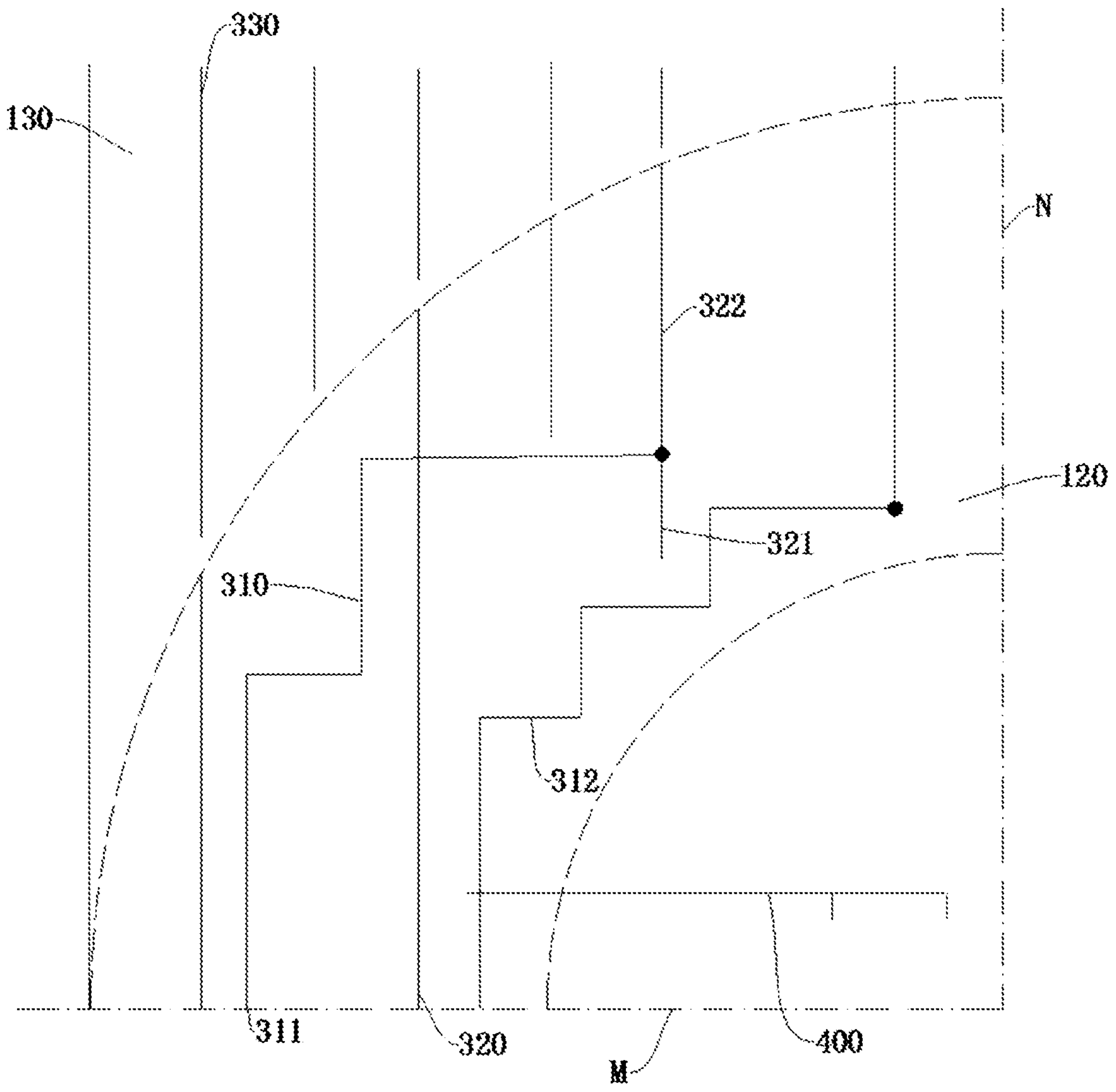
FIG. 9 shows a partially enlarged schematic structural diagram of FIG. 2 in yet another example.

Referring to FIGS. 8 and 9 together, FIG. 8 illustrates a partially enlarged schematic structural diagram of FIG. 2 in another example, and FIG. 9 differs from FIG. 8 in that the pixel circuit and the pixel unit are not illustrated in FIG. 9.

In some optional embodiments, the second pixel units 130 and the second pixel circuits 230 are arranged with a one-to-one correspondence, the transition display area AA2 and the first display area AA1 each include M columns of pixel units, two first pixel units 110 are connected to a same first pixel circuit 210, and two transition pixel units 120 are connected to a same transition pixel circuit 220. The M columns of first pixel units 110 in the first display area AA1 corresponds to M/2 columns of first pixel circuits 210, and the M columns of first pixel units 110 in the transition display area AA2 corresponds to M/2 columns of transition pixel circuits 220. Further, M columns of pixel circuits are formed in the transition display area AA2, so that a sum of numbers of the first signal lines 310 and the transition signal lines 320 in the transition display area AA2 is M. The first ratio is equal to the second ratio.

As shown in FIG. 7, the second pixel units 130 and the second pixel circuits 230 are arranged with a one-to-one correspondence, and the transition display area AA2 and the first display area AA1 each include 8 columns of pixel units. As shown in FIG. 8, two first pixel units 110 adjacent in the first direction are connected to a same first pixel circuit 210, and two transition pixel units 120 adjacent in the first direction are connected to a same transition pixel circuit 220. The 4 columns of first pixel units 110 in the first display area AA1 corresponds to 2 columns of first pixel circuits 210, and the 4 columns of first pixel units 110 in the transition display area AA2 corresponds to 2 columns of transition pixel circuits 220. The sum of numbers of the first signal lines 310 and the transition signal lines 320 in the transition display area AA2 is 8, and 8 columns of pixel circuits are formed in the transition display area AA2. The first ratio is equal to the second ratio. FIG. 8 merely illustrates that one set of two first pixel units 110 adjacent in the first direction are interconnected with the first pixel circuit 210 by the connecting wire 400.

Optionally, if two or more transition pixel units 120 are connected to a same transition pixel circuit 220, two or more transition pixel units 120 with a same color are connected to a same transition pixel circuit 220, so that the same transition pixel circuit 220 is configured to drive a plurality of transition pixel units 120 with the same color.

Optionally, a size of the first pixel unit 110 is less than a size of the transition pixel unit 120 with a same color, the space occupied by the first pixel unit 110 in the first display area AA1 can be reduced, so that the area of the non-light emitting area in the first display area AA1 is greater, which facilitates increasing the light transmittance of the first display area AA1.

Optionally, a size of the first pixel unit 110 is less than a size of the second pixel unit 130 with a same color, the space occupied by the first pixel unit 110 in the first display area AA1 can be reduced, so that the area of the non-light emitting area in the first display area AA1 is greater, which facilitates increasing the light transmittance of the first display area AA1.

Optionally, a size of the transition pixel unit 120 is less than a size of the second pixel unit 130, the space occupied by the transition pixel unit 120 in the transition display area AA2 can be reduced, so that the area of the non-light emitting area in the transition display area AA2 is greater, which facilitates further increasing the light transmittance of the transition display area AA2.

In some other embodiments, the size of the second pixel unit 130 is the same as the size of the transition pixel unit 120 with a same color, therefore the display difference between the transition display area AA2 and the second display area AA3 is reduced and the display uniformity is improved.

Optionally, two or more adjacent first pixel units 110 with a same color are connected to a same first circuit 210, facilitating the wiring of the display panel 10.

Optionally, as shown in FIGS. 4 and 7, if the first signal lines 310 and the transition signal lines 320 corresponding to the first pixel units 110 and the transition pixel units 120 located in a same column are connected to each other, the first signal line 310 may be connected to an end of the transition signal line 320, or the first signal line 310 may be connected between two ends of the transition signal line 320, provided that the first signal line 310 is connected to the transition signal line 320.

Optionally, some of the first signal lines 310 are connected to an end of the transition signal line 320, and some others of the first signal line 310 are connected between two ends of the transition signal line 320.

If at least one of the first signal lines 310 is connected between two ends of the transition signal line 320, at least one of the transition signal lines 320 includes a third segment 321 and a fourth segment 322, the third segment 321 and at least part of the first signal line 310 are overlapped along the first direction, the fourth segment 322 and the first signal line 310 are staggered along the first direction, and a material of the third segment 321 includes a transparent material. The display difference between the transition display area AA2 and the second display area AA3 can be further reduced, and the display effect of the display panel 10 is improved.

Optionally, the third segment 321 and the second segment 312 are arranged in a same layer and with a same material, the preparation process of the display panel 10 can be simplified and the preparation efficiency of the display panel 10 is improved.

In some other optional embodiments, the fourth segment 322 and the first segment 311 are arranged in a same layer and with a same material, the preparation process of the display panel 10 can be simplified and the preparation efficiency of the display panel 10 is improved.

In yet some other optional embodiments, in order to further simplify the preparation process of the display panel 10, the second segment 312, the connecting wire 400, and the third segment 321 are arranged in a same layer and with a same material.

Figure 10:
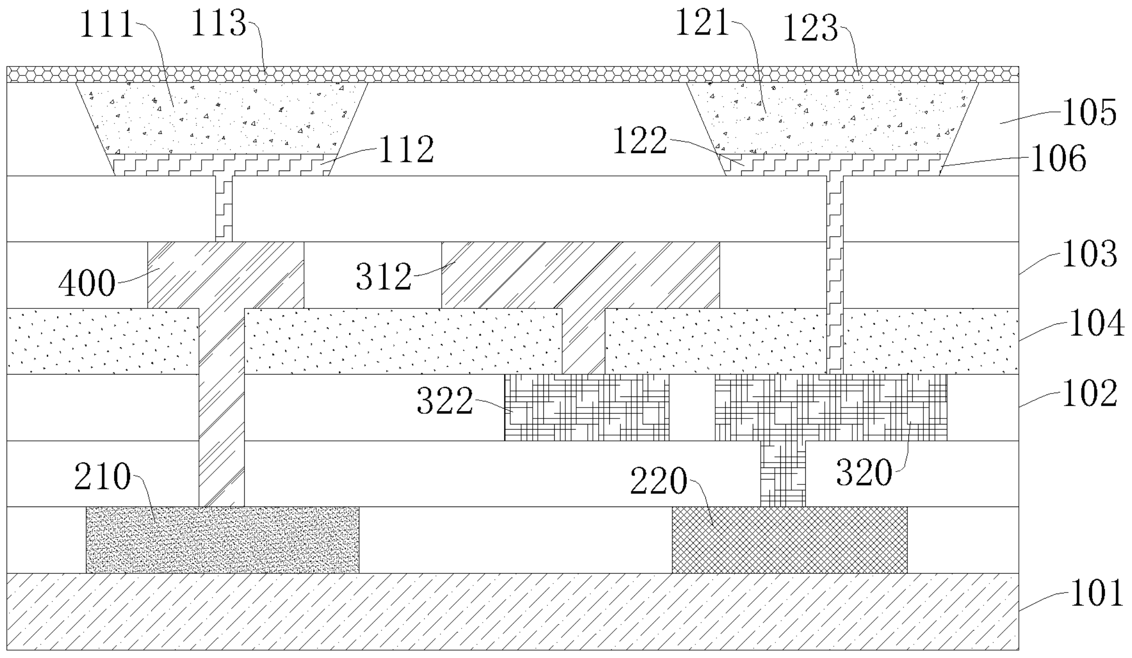
FIG. 10 shows a partially cross-sectional view of FIG. 4.

Referring to FIG. 10, which shows a partially cross-sectional view of FIG. 4. FIG. 10 illustrates a position relationship of the first signal line 310, the transition signal line 320, the first pixel circuit 210 and the transition pixel circuit 220, and the first signal line 310, the transition signal line 320, the first pixel circuit 210 and the transition pixel circuit 220 may be arranged in other position relationships.

Optionally, the display panel 10 further includes: a substrate 101; a first conductive layer 102, the fourth segment 322 and the first segment 311 are located in the first conductive layer 102; a second conductive layer 103, the third segment 321 and the second segment 312 are located in the second conductive layer 103, the first conductive layer 102 and the second conductive layer 103 are distributed on a same side of the substrate 101; an insulating layer 104 located between the first conductive layer 102 and the second conductive layer 103, a connection opening is arranged in the insulating layer 104 to interconnect the first signal line 310 and the transition signal line 320.

In these optional embodiments, the fourth segment 322 and the first segment 311 are located in different layer structures from the third segment 321 and the second segment 312, so that the fourth segment 322 and the first segment 311 can be manufactured using the same material and the third segment 321 and the second segment 312 can be manufactured using the same material, the preparation process of the display panel 10 is simplified.

Optionally, the connecting wire 400, the third segment 321 and the second segment 312 are located in the second conductive layer 103, which can further simplify the preparation process of the display panel 10.

The substrate 101 may be made of a light-transmitting material such as glass, Polyimide (PI), etc.

The relative position of the first conductive layer 102 and the second conductive layer 103 may be set in variety of ways, for example, the second conductive layer 103 is located at a side of the first conductive layer 102 away from the substrate 101, or the second conductive layer 103 is located at a side of the first conductive layer 102 facing the substrate 101.

Optionally, the display panel 10 further includes a pixel electrode layer, the second conductive layer 103 is located at a side of the first conductive layer 102 away from the substrate 101, and the pixel electrode layer is located at a side of the second conductive layer 103 away from the first conductive layer 102. In these optional embodiments, the second conductive layer 103 is closer to the pixel electrode layer to facilitate interconnection of the connecting wire 400 with the pixel electrodes.

In some optional embodiments, the display panel 10 further includes: a pixel definition layer 105 located at a side of the first conductive layer 102 and the second conductive layer 103 away from the substrate 101, the pixel definition layer 105 includes a first pixel opening located in the first display area AA1; the first pixel unit 110 includes a first light-emitting structure 111, a first electrode 112, and a second electrode 113, the first light-emitting structure 111 is located in the first pixel opening, the first electrode 112 is located at a side of the first light-emitting structure 111 facing the substrate 101, and the second electrode 113 is located at a side of the first light-emitting structure 111 away from the substrate 101. One of the first electrode 112 and the second electrode 113 is an anode, and the other is a cathode.

Optionally, the pixel definition layer 105 further includes a second pixel opening located in the transition display area AA2 and a third pixel opening located in the second display area AA3.

In some embodiments, the transition pixel unit 120 includes a second light-emitting structure 121, a third electrode 122, and a fourth electrode 123. The second light-emitting structure 121 is located in the second pixel opening, the third electrode 122 is located at a side of the second light-emitting structure 121 facing the substrate 101, and the fourth electrode 123 is located at a side of the second light-emitting structure 121 away from the substrate 101. One of the third electrode 122 and the fourth electrode 123 is an anode, and the other is a cathode.

In some embodiments, the second pixel unit 130 includes a third light-emitting structure, a fifth electrode, and a sixth electrode. The third light-emitting structure is located in the third pixel opening, the fifth electrode is located at a side of the third light-emitting structure facing the substrate 101, and the sixth electrode is located at a side of the third light-emitting structure away from the substrate 101. One of the fifth electrode and the sixth electrode is an anode, and the other is a cathode.

In the embodiment, for example, the first electrode 112, the third electrode 122, the fifth electrode is the anode, and the second electrode 113, the fourth electrode 123, and the sixth electrode is the cathode. The first electrode 112, the third electrode 122, and the fifth electrode are located, for example, in the pixel electrode layer.

The first light-emitting structure 111, the second light-emitting structure 121, and the third light-emitting structure may each include an organic light emitting diode (OLED) light-emitting layer, and according to the design requirements of first light-emitting structure 111, the second light-emitting structure 121, and the third light-emitting structure, they may each further include at least one of a hole inject layer, a hole transport layer, an electron inject layer or an electron transport layer.

In some embodiments, the first electrode 112 is a light-transmitting electrode. In some embodiments, the first electrode 112 includes an indium tin oxide (Indium Tin Oxide, ITO) layer or an indium zinc oxide layer. In some embodiments, the first electrode 112 is a reflective electrode and includes a first light-transmitting conductive layer, a reflective layer on the first light-transmitting conductive layer, and a second light-transmitting conductive layer on the reflective layer. Herein, the first light-transmitting conductive layer and the second light-transmitting conductive layer may be ITO, indium zinc oxide or the like, and the reflective layer may be a metal layer, for example, made of silver. The third electrode 122 and the fifth electrode may be configured to use the same material as the first electrode 112.

In some embodiments, the second electrode 113 includes a magnesium-silver alloy layer. The fourth electrode 123 and the sixth electrode may configured to use the same material as the second electrode 113. In some embodiments, the second electrode 113, the fourth electrode 123, and the sixth electrode may be interconnected as a common electrode.

In some embodiments, an orthographic projection of the first light-emitting structure 111 on the substrate 101 consists of one first graphic unit or two or more first graphic units spliced together, and the first graphic unit includes at least one selected from a group including a round shape, an oval shape, a dumb-bell shape, a gourd shape and a rectangle shape.

In some embodiments, an orthographic projection of the first electrode 112 on the substrate 101 consists of one second graphic unit or two or more second graphic units spliced together, and the second graphic unit includes at least one selected from a group including a round shape, an oval shape, a dumb-bell shape, a gourd shape and a rectangle shape.

In some embodiments, an orthographic projection of the second light-emitting structure 121 on the substrate 101 consists of one third graphic unit or two or more third graphic units spliced together, and the third graphic unit includes at least one selected from a group including a round shape, an oval shape, a dumb-bell shape, a gourd shape and a rectangle shape.

In some embodiments, an orthographic projection of the third electrode 122 on the substrate 101 consists of one fourth graphic unit or two or more fourth graphic units spliced together, and the fourth graphic unit includes at least one selected from a group including a round shape, an oval shape, a dumb-bell shape, a gourd shape and a rectangle shape.

Exemplarily, the display panel 10 may further include an encapsulation layer, and a polarizer and a cover plate that are disposed on the encapsulation layer. Alternatively, the cover plate may be directly arranged on the encapsulation layer without the polarizer, or the cover plate is at least directly arranged on the encapsulation layer in the first display area AA1 without the polarizer, so as to prevent the polarizer from affecting the light collection amount of the photosensitive component correspondingly arranged under the first display area AA1. Of course, the polarizer may also be arranged on the encapsulation layer in the first display area AA1.

The embodiments of the second aspect of the present application further provide a display apparatus which may include the display panel 10 of any one of the above embodiments. A display apparatus of an embodiment will be described below as an example, in which the display apparatus includes the display panel 10 of the above embodiments. In the display apparatus of the embodiment, the display panel 10 may be the display panel 10 of one of the above embodiments, in which the display panel 10 includes the first display area AA1 and the transition display area AA2, and the light transmittance of the first display area AA1 is greater than the light transmittance of the transition display area AA2.

In some optional embodiments, the display apparatus further includes a photosensitive component arranged at a side of the display panel 10, and an orthographic projection of the photosensitive component on the display panel 10 is located in the first display area AA1 so that the photosensitive component can obtain light information through the first display area AA1.

The photosensitive component may be an image capturing component for capturing external image information. For example, the photosensitive component is a complementary metal oxide semiconductor (Complementary Metal Oxide Semiconductor, CMOS) image capturing component, and in some other embodiments, the photosensitive component may be other image capturing components such as a charge-coupled device (Charge-coupled Device, CCD) image capturing component. The photosensitive component may not be limited to an image capturing component, for example, in some embodiments, the photosensitive component may be a light sensor such as an infrared sensor, a proximity sensor, an infrared lens, a flood light sensing element, an ambient light sensor and a dot projector.

According to the display apparatus of the embodiments of the present application, the light transmittance of the first display area AA1 is greater than the light transmittance of the transition display area AA2, so that the photosensitive component can be integrated on the rear of the first display area AA1 of the display panel 10. An under-screen integration is achieved for the photosensitive component such as an image capturing component, and moreover, the first display area AA1 can display the image, the display area of the display panel 10 is increased and a full-screen design is achieved for the display apparatus.

In some other optional embodiments, the photosensitive component may be a fingerprint recognition sensor. Since the light transmittance of the first display area AA1 is greater, the photosensitive component can obtain more accurate fingerprint information through the first display area AA1.

The above embodiments of the present application do not exhaustively describe all the details, nor do they limit the present application only to the specific embodiments. Obviously, according to the above description, many modifications and changes can be made. These embodiments are selected and specifically described in the specification to better explain the principles and practical applications of the present application, so that those skilled in the art can make good use of the present application and make modifications based on the present application. The present application is limited only by the claims and full scope and equivalents thereof.

What is claimed is:

1. A display panel comprising
a first display area,
a second display area, and
a transition display area located between the first display area and the second display area,
a light transmittance of the first display area being greater than a light transmittance of the transition display area, the display panel comprising:
first pixel units located in the first display area and each comprising a first sub-pixel,
a second sub-pixel, and
a third sub-pixel, the first sub-pixels,
the second sub-pixels and the third sub-pixels being arranged in an array,
transition pixel units located in the transition display area,
first pixel circuits distributed along annular areas in the transition display area and each comprising a first circuit for driving the first sub-pixel,
a second circuit for driving the second sub-pixel, and
a third circuit for driving the third sub-pixel,
the first circuits, the second circuits and the third circuits being arranged in an array in the transition display area,
transition pixel circuits located in the transition display area and configured to drive the transition pixel units; and
signal lines comprising:
first signal lines located in the transition display area,
the first signal lines being connected to a plurality of first pixel circuits for driving the first pixel units in a same column;
the first signal line comprising a first segment and a second segment connected successively,
the first segment being configured to connect the first pixel circuits located in different rows and the second segment being configured to connect the first pixel circuits located in different columns;
transition signal lines located in the transition display area,
the transition signal lines being connected to a plurality of transition pixel circuits for driving the transition pixel units in a same column, and
the first signal line and the transition signal line corresponding to the first pixel unit and the transition pixel unit located in a same column being connected to each other,
the first pixel circuits for driving the first pixel units in a same column are located in at least two adjacent columns, and
an arrangement pattern of the first circuits and the second circuits is the same as an arrangement pattern of the first sub-pixels and the second sub-pixels respectively driven by the first circuits and the second circuits.

2. The display panel of claim 1, wherein
the first sub-pixels and the second sub-pixels are alternately arranged along a second direction to form first pixel columns, two first pixel columns adjacent in a first direction are staggered along the second direction, so that the first sub-pixels and the second sub-pixels are alternately arranged along the first direction; and
the first circuits and the second circuits are arranged along the second direction to form first circuit columns, the first circuits and the second circuits for driving at least one first pixel column are located in at least two first circuit columns adjacent along the first direction.

3. The display panel of claim 1, wherein the third sub-pixels are arranged in sequence along a second direction to form a second pixel column, a plurality of the third circuits are arranged along the second direction to form a second circuit column, and an arrangement pattern of the third circuits is the same as an arrangement pattern of the third sub-pixels.

4. The display panel of claim 1, wherein the first circuit and the first sub-pixel driven by the first circuit are arranged in a same row, the second circuit and the second sub-pixel driven by the second circuit are arranged in a same row, and the third circuit and the third sub-pixel driven by the third circuit are arranged in a same row.

5. The display panel of claim 1, further comprising
a connecting wire, wherein:
the first pixel circuit and the first pixel unit connected to the first pixel circuit are arranged in a same row,
the connecting wire extends in a first direction and is configured to connect the first pixel unit and the first pixel circuit, and
a material of the connecting wire comprises a transparent material.

6. The display panel of claim 5, wherein a material of the second segment and the material of the connecting wire both comprise a transparent material, and the connecting wire and the second segment are arranged in a same layer.

7. The display panel of claim 1, wherein, for the first signal line and the transition signal line corresponding to the first pixel unit and the transition pixel unit located in a same column, the transition signal line is located on at least one side of the first pixel unit in the column in a second direction.

8. The display panel of claim 1, wherein a size of the first pixel unit is less than a size of the transition pixel unit with a same color.

9. The display panel of claim 1, further comprising:
second pixel units located in the second display area;
second pixel circuits for driving the second pixel units and located in the second display area, wherein:
the signal lines further comprise second signal lines located in the second display area,
the second signal lines being connected to a plurality of second pixel circuits for driving the second pixel units in a same column,
a ratio between a column number of the second pixel units and a number of the second signal lines is a first ratio, and
a ratio between a column number of the transition pixel units and a sum of numbers of the first signal lines and the transition signal lines is a second ratio equal to the first ratio.

10. The display panel of claim 9, wherein a size of the first pixel unit is less than a size of the second pixel unit with a same color.

11. The display panel of claim 9, wherein a size of the transition pixel unit is less than a size of the second pixel unit with a same color.

12. The display panel of claim 1, wherein;
the first signal lines are connected to one end of the transition signal lines; or
the first signal lines are connected between two ends of the transition signal lines,
at least one of the transition signal lines comprises a third segment and a fourth segment,
the third segment and at least part of the first signal lines are overlapped along a first direction,
the fourth segment and the first signal lines are staggered along the first direction, and
a material of the third segment comprises a transparent material.

13. The display panel of claim 12, wherein the third segment and the second segment are arranged in a same layer and with a same material.

14. The display panel of claim 12, wherein the fourth segment and the first segment are arranged in a same layer and with a same material.

15. The display panel of claim 1, wherein:

the transition display area comprises a plurality of annular areas surrounding a circumference of the first display area and being distributed concentrically with the first display area, and the first pixel circuits for driving the first pixel units in a same column are distributed in sequence within a same annular area;

the first display area is arranged symmetrically about a second axis of symmetry, the second axis of symmetry extends along a second direction and passes through a center of the first display area, the first pixel circuits corresponding to two columns of first pixel units distributed symmetrically about the second axis of symmetry are located in a same annular area, and the first pixel circuit is located at a side of the first pixel unit connected to the first pixel circuit away from the second axis of symmetry; and two transition signal lines for connecting the first pixel circuits in a same annular area are arranged symmetrically about the second axis of symmetry.

16. The display panel of claim 15, wherein a plurality of the first pixel circuits are arranged symmetrically about the second axis of symmetry, and a plurality of the transition signal lines are arranged symmetrically about the second axis of symmetry.

17. The display panel of claim 15, wherein a plurality of the first pixel circuits are arranged symmetrically about a first axis of symmetry extending along a first direction and passing through the center of the first display area, and the transition signal lines are arranged symmetrically about the first axis of symmetry.

18. A display apparatus comprising the display panel of claim 1.

* * * * *